United States Patent
Sagberg et al.

(10) Patent No.: US 12,216,049 B2
(45) Date of Patent: Feb. 4, 2025

(54) GAS SENSORS

(71) Applicant: DRÄGER SAFETY AG & CO. KGaA, Lübeck (DE)

(72) Inventors: Håkon Sagberg, Oslo (NO); Britta Grennberg Fismen, Oslo (NO); Kari Anne Hestnes Bakke, Hvittingfoss (NO); Jon Tschudi, Oslo (NO); Ib-Rune Johansen, Oslo (NO); Knut Baeroe Sandven, Oslo (NO)

(73) Assignee: DRÄGER SAFETY AG & CO. KGaA, Lübeck (DE)

(*) Notice: Subject to any disclaimer, the term of this patent is extended or adjusted under 35 U.S.C. 154(b) by 172 days.

(21) Appl. No.: 17/679,650

(22) Filed: Feb. 24, 2022

(65) Prior Publication Data

US 2022/0276159 A1     Sep. 1, 2022

Related U.S. Application Data (63) Continuation-in-part of application No. 17/119,472, filed on Dec. 11, 2020, now abandoned, which is a (Continued)

(30) Foreign Application Priority Data

Dec. 5, 2011 (GB) .................................. 1120871

(51) Int. Cl.
   *G01N 21/3504*     (2014.01)
   *G01N 21/31*     (2006.01)
   *G01R 27/26*     (2006.01)

(52) U.S. Cl.
   CPC ....... *G01N 21/3504* (2013.01); *G01N 21/314* (2013.01); *G01R 27/2605* (2013.01); *G01N 2021/317* (2013.01); *G01N 2021/3513* (2013.01); *G01N 2201/061* (2013.01); *G01N 2201/0693* (2013.01);
(Continued)

(58) Field of Classification Search
CPC ......... G01N 21/3504; G01N 2021/317; G01N 2201/12761; G01N 2201/12784
See application file for complete search history.

(56) References Cited

U.S. PATENT DOCUMENTS

| | | | |
|---|---|---|---|
| 5,646,729 A | 7/1997 | Koskinen et al. | |
| 6,540,690 B1 * | 4/2003 | Kanstad | G01J 3/108 |
| | | | 250/504 R |

(Continued)

*Primary Examiner* — David P Porta
*Assistant Examiner* — Shun Lee
(74) *Attorney, Agent, or Firm* — McGlew and Tuttle, P.C.

(57) ABSTRACT

A gas sensor for measuring concentration of a predetermined gas includes a light source (2) arranged to emit pulses of light, a measurement volume (10), a detector (4) arranged to receive light that has passed through the measurement volume (10), and an adaptable filter (6) disposed between the light source (2) and the detector (4). The gas sensor has a measurement state in which it passes at least one wavelength band which is absorbed by the gas and a reference state in which said wavelength band is attenuated relative to the measurement state. A controller is connected to each of the light source, the detector and the adaptable filter to change the adaptable filter between one of said measurement state and said reference state to the other at least once during a gas sensor operation period.

22 Claims, 5 Drawing Sheets

Related U.S. Application Data continuation of application No. 14/362,944, filed as application No. PCT/GB2012/053021 on Dec. 5, 2012, now abandoned.

(52) U.S. Cl.
CPC ................ *G01N 2201/0696* (2013.01); *G01N 2201/12761* (2013.01); *G01N 2201/12784* (2013.01); *G01N 2201/128* (2013.01)

(56) References Cited

U.S. PATENT DOCUMENTS

| | | |
|---|---|---|
| 2005/0099618 A1 | 5/2005 | Difoggio et al. |
| 2009/0115068 A1 | 5/2009 | Jang |
| 2012/0078532 A1 | 3/2012 | Forsyth et al. |

* cited by examiner

GAS SENSORS

CROSS REFERENCE TO RELATED APPLICATIONS

This application is a continuation of pending U.S. application Ser. No. 17/119,472, which is a continuation of U.S. application Ser. No. 14/362,944, having a 35 U.S.C. 371 (c)(1), (2) date of Jun. 5, 2014, which is a United States National Phase Application of International Application PCT/GB2012/053021, filed Dec. 5, 2012, and claims the benefit of priority under 35 U.S.C. § 119 of United Kingdom Application 1120871.7, filed Dec. 5, 2011, the entire contents of which are incorporated herein by reference.

TECHNICAL FIELD

This invention relates to gas sensors, particularly sensors for measuring the concentration of a gas by measuring the absorption of infra-red light thereby.

TECHNICAL BACKGROUND

In order to operate gas sensors on battery power for long periods of time, typically more than one year, the energy consumption must be low. One way of reducing the energy consumption is to keep the sensor in sleep or shutdown mode most of the time, and to turn it on at regular or irregular intervals. A typical power requirement for a continuously powered infrared sensor is on the order of 0.1-1 W. If one measurement takes one second to complete for a non-continuously operated sensor, as an example, and the required response time is 10 s, the duty cycle becomes 10%, with a corresponding reduction in energy consumption to 10-100 mW. In the low end of this range, battery operation becomes a possibility. The response time requirements will be different for different applications. There are two modes of operation which may be required of a gas sensor that can be operated at low duty cycle. The first is intermittent or sporadic use. Here the gas sensor would be started with irregular intervals, on demand. The measurements could be triggered manually or by a second sensor that monitors for changes in the ambient and estimates a probability that gas may be present. In this mode, the response time for the intermittent sensor could be almost as short as for a continuous sensor, as long as that the wake up time is short enough.

The second mode is cyclic (or stand-alone) use. For cyclic measurement the maximum response time will be limited by the cycle period. As long as the required period/response time is longer than the time needed for a single measurement, the cyclic mode will require less power. Again, a sufficiently short wake-up time is necessary.

For both these modes to be efficient, it is necessary that the sensor can be 'cold started' in a time interval much less than the typical time between measurements, and that reliable, accurate measurements will be available after such a short start-up time. The present invention aims to provide a sensor and method that makes this possible. Simple NDIR (non-dispersive infra red) gas sensors measure concentration using a single light source and a single detector. These are generally not suitable for safety applications or applications that require good long-term stability without recalibration.

Existing reliable gas sensors use different methods and configurations to compensate for errors, for example two light sources and one detector, or two detectors and one light source, or two of each (doubly compensated). In a state-of-the-art doubly compensated sensor, one source is provided with a filter for the 'active' wavelength band where the gas absorbs, and the other source is filtered so that it emits a 'reference' wavelength band. The sources are usually modulated with frequencies in the range of 1-100 Hz. A reference detector monitors the source intensities, while the main detector measures the light transmitted from the two sources through the measurement volume and detects if light has been absorbed by the gas. This set-up compensates for several errors, such as light loss in the measurement volume, and source intensity changes. A good compensation, however, depends on a sufficiently (thermally) stable system. This is of special importance when the source modulation frequency is low, or if the two detectors are mounted so that they see different areas of the source surface. (The temperature on a thermal infra-red source surface is highly non-uniform). In some cases, a warm-up time of several minutes is required before the measurement error is sufficiently low.

SUMMARY

When viewed from a first aspect the invention provides a gas sensor for measuring concentration of a predetermined gas comprising a light source arranged to emit pulses of light, a measurement volume, a detector arranged to receive light that has passed through the measurement volume, and an adaptable filter disposed between the light source and the detector and having a measurement state in which it passes at least one wavelength band which is absorbed by the gas and a reference state in which said wavelength band is attenuated relative to the measurement state wherein the adaptable filter is arranged to change between one of said measurement state and said reference state to the other at least once during each pulse.

The invention extends to a wireless, battery-operated gas detector unit comprising a gas sensor as set out above.

When viewed from a second aspect the invention provides a method of measuring a concentration of a predetermined gas comprising passing a pulse of light through a measurement volume to a detector via an adaptable filter disposed between the light source and the detector, switching said filter at least once in each pulse to/from a measurement state in which it passes at least one wavelength band which is absorbed by the gas and a reference state in which the wavelength band is attenuated compared to the measurement state; the method comprising determining said concentration of gas from the difference in light received by the detector in said measurement and reference states respectively.

Thus it will be appreciated that in accordance with the invention a fully referenced gas concentration measurement can be taken using a single pulse of light from a single light source and using a single detector. This enables a low power consumption fast start-up from cold state and reliable, accurate measurement in a short measurement period. Thus it opens up the possibility of a remote, battery-powered wireless sensor unit with a long battery life but which in the preferred embodiments can have the reliability and stability of a doubly compensated system.

In accordance with the invention the adaptable filter directs the light from the source onto the detector. By changing its state, the wavelengths of light it passes are changed. Preferably it comprises a micro-electromechanical system (MEMS). These can be fabricated so as to be able to change the wavelengths of light passed. The change can be performed on a timescale less than one millisecond which means that a short pulse of light can be used whilst still giving both a measurement and reference period, thereby limiting the power consumption associated with the measurement. The MEMS could comprise a diffractive optical element having a plurality of grating bands arranged to be moved by an electrostatic potential.

The MEMS solution is particularly convenient for 'cold starting' the sensor system and performing a complete measurement using a single pulse of light. This can be done because the wavelength modulation can be so fast that drift or low-frequency noise can be filtered, and because the 'active' and 'reference' wavelength bands are measured using exactly the same light path. Drift, non-uniformity, and other error sources will affect the two measurements equally.

The invention is not limited to the adaptable filter having only two states; it may have three or more states. This could provide a plurality of measurement/reference states—e.g. to allow the concentrations of different predetermined gases to be measured or to compensate for the presence of a particular interfering gas or another known type of disturbance of the spectrum.

Thus in a set of embodiments the adaptable filter comprises a plurality of measurement states in each of which it passes at least one wavelength band which is absorbed by the gas and for each measurement at least one reference state in which the wavelength band corresponding to the measurement state is attenuated relative to said measurement state. The sensor could be arranged such that each measurement state is used in each pulse or different measurement states may be used in different pulses—e.g. different gasses could be measured in alternating light pulses.

The adaptable filter could, for example, comprise a unitary structure having a plurality of positions, or it could comprise a plurality of filter elements each having two or more states and arranged to give the desired overall states. In either case a MEMS is preferred.

As used herein the term 'pulse' as applied to light is intended to mean a temporary emission or increase in light output. No particular pulse shape is to be inferred and it is not necessarily the case that outside of pulses there is no light emission. The length of a pulse may be defined as the length of time for which the light is above a predetermined threshold. The pulse width may in some embodiments be between 5 milliseconds and 5 seconds—e.g. between 10 and 1000 milliseconds.

As discussed previously the pulse frequency may be irregular where measurement is sporadic or on-demand. Alternatively it may be regular—e.g. less than once every 10 seconds, or less than once every 30 seconds, or less than once a minute, or less than once an hour, or less than once a day.

The light source could be a thermal source, such as a filament lamp or heated membrane, or a solid-state source such as a diode. What is important is that the source emits light in both the measurement and reference wavelength bands. The adaptable filter could be switched between its reference and measurement state or vice versa just once per pulse. Preferably it is switched regularly between said measurement and reference states a plurality of times during each pulse. In some embodiments it may be switched more than 10 times per pulse, e.g. more than 25 times or more than 50 times per pulse. The number of times it switches may be controlled to give a required accuracy level.

In a set of embodiments the sensor measures the rate at which the output from the detector for no input, known as the "dark level" of the detector, changes with time. This allows a more accurate gas concentration measurement to be taken since such changes can then be compensated for.

A preferred embodiment of the invention will now be described, by way of example only, with reference to the accompanying drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION

Figure 1A:
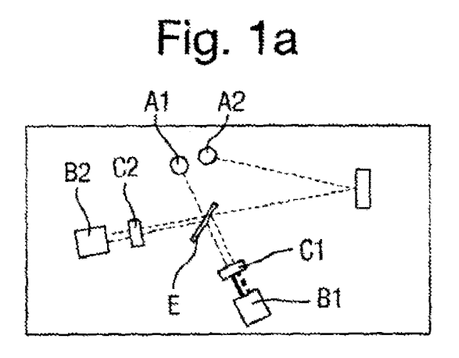
FIGS. 1a and 1b are schematic diagrams showing a prior art doubly-compensated sensor during measurements of clean air and of a significant amount of the predetermined gas respectively.
Figure 1B:
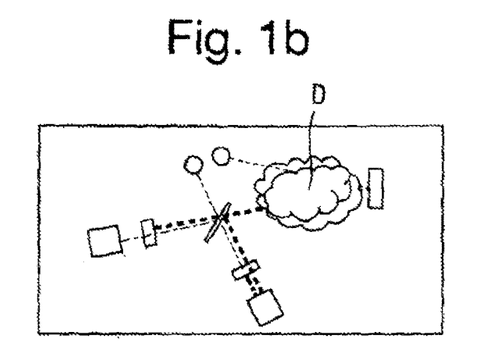
Figure 2A:
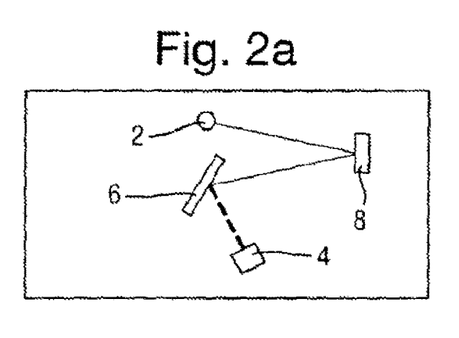
FIGS. 2a and 2b are schematic diagrams showing a sensor in accordance with the invention during measurements of clean air and of a significant amount of the predetermined gas respectively.
Figure 2B:
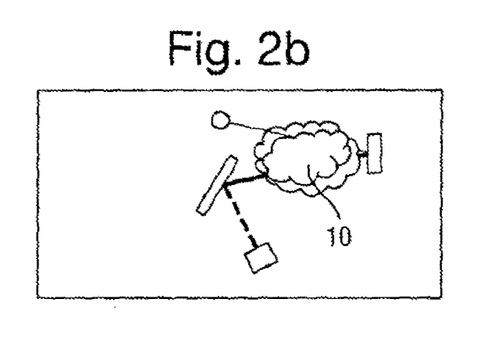

Turning first to FIGS. 1 and 2 there may be seen a comparison between a prior art doubly-compensated sensor in FIGS. 1a and 1b and an embodiment of the invention in FIGS. 2a and 2b. The doubly compensated system shown in FIG. 1a is typically implemented in commercially available detectors for safety applications. In this doubly compensated system, two light sources A1, A2 and two detectors B1, B2 ensure that the measurements are minimally influenced by e.g. dirty optics, light source drift, temperature. Two different filters C1.C2 are used. One filter, C1 transmits a wavelength band which the gas being measured absorbs. The other filter C2 is a reference filter that transmits a neighboring wavelength band.

As may be seen in FIG. 1b, the light from one infra-red source A2 passes through the measurement volume D and then to a beam-splitter E so that it impinges on both filters C1 and C2. If the gas of interest is present it will absorb light of certain wavelengths. The light from the other infra-red source A1 does not pass through the measurement volume D but is directly incident on the beam-splitter E and so on both filters C1 and C2.

Absorption by the gas will result in a reduction in the signal detected by the first detector B1 but will not affect the signal at the reference detector B2. The difference between the signals at the respective detectors can be used to calculate the concentration of gas. Such detectors are in general effective and reliable in safety-critical applications. However the provision of two sources and two detectors makes them relatively expensive to manufacture and they need a relatively large amount of power in operation. Also, they need a certain warm-up time in order to reach steady-state with uniform source temperature modulation which is necessary for reliable measurements.

An embodiment of the present invention is shown in FIGS. 2a and 2b. Here there is only a single infra-red source 2 and a single detector 4. The light passes from the source 2, via a mirror 8 and an adaptive MEMS filter 6 to the detector 4. As FIG. 2b shows it passes twice through the measurement volume 10, although this is not essential. In use the filter element 6 is switched repeatedly between two different states so that the emergent light has one of two possible wavelengths associated with the respective states. One of these wavelengths is in the absorption band of the gas of interest and the other is not. Thus, as before, the concentration of gas can be calculated from the output of the detector 4 corresponding to the two respective states. Unlike the prior art arrangement however the light path is the same for both the reference and active wavelengths, and there are no beam-splitters. If the source has a non-uniform intensity, there is dirt on the optical surfaces, or the detector response changes, both measurements are affected in the same way. The filter element 6 is holographic so all light paths contribute to both the active and reference measurement. The switching between the two states is so fast that a varying/drifting source can be tolerated.

Figure 3:
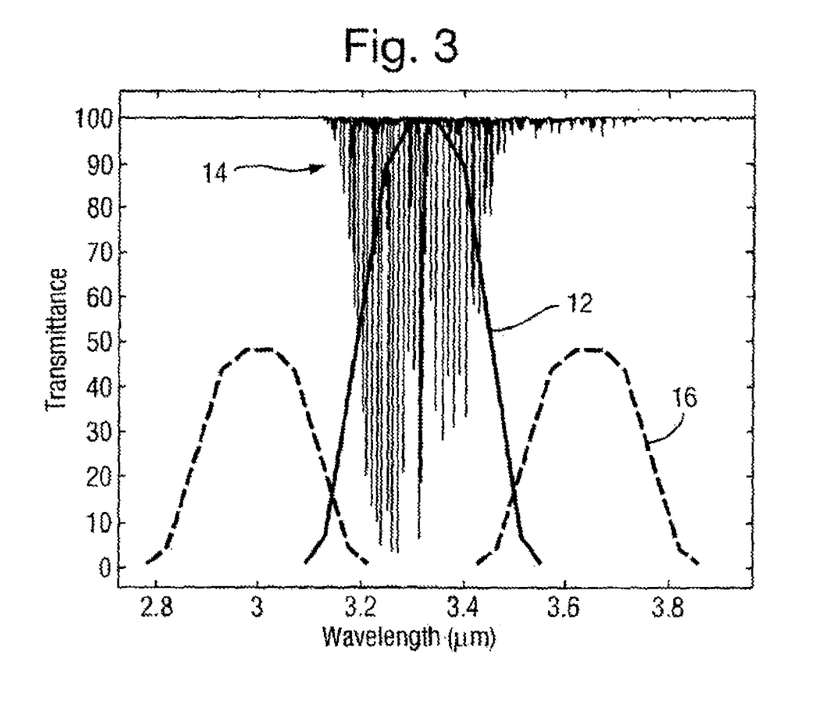
FIG. 3 is a graph showing the two states of the filter element and their relationship to the absorption spectrum of the gas being measured.

FIG. 3 shows the reflection spectra of the filter element 6 in its two states. The solid line 12 shows the reflection spectrum of the filter during the measurement state. Here it will be seen that in this state there is a single central peak of wavelengths passed which coincides with the peak of the absorption spectrum 14 of a hydrocarbon gas (shown superimposed at the top of FIG. 3). In the measurement state the filter therefore passes a band of wavelengths which are absorbed by the gas. The light in this wavelength ban will therefore be affected by the concentration of gas since this will affect how much of it is absorbed.

When the filter element is switched to its reference state however the filter characteristics are changed as shown by the dashed line 16 so that light is passed in two bands on either side of the peak in the absorption spectrum 14 and the wavelength band previously passed in the measurement state (with the central peak) is significantly attenuated compared to that state. Because the pass band from the measurement state is attenuated in the reference state, here the light passed will not be significantly affected by the concentration of gas since the light which is passed will not be significantly absorbed by the gas.

The absorption spectrum 14 shown here is merely illustrative and may differ for different gasses—e.g. it may have more than one absorption peak.

Figure 4:
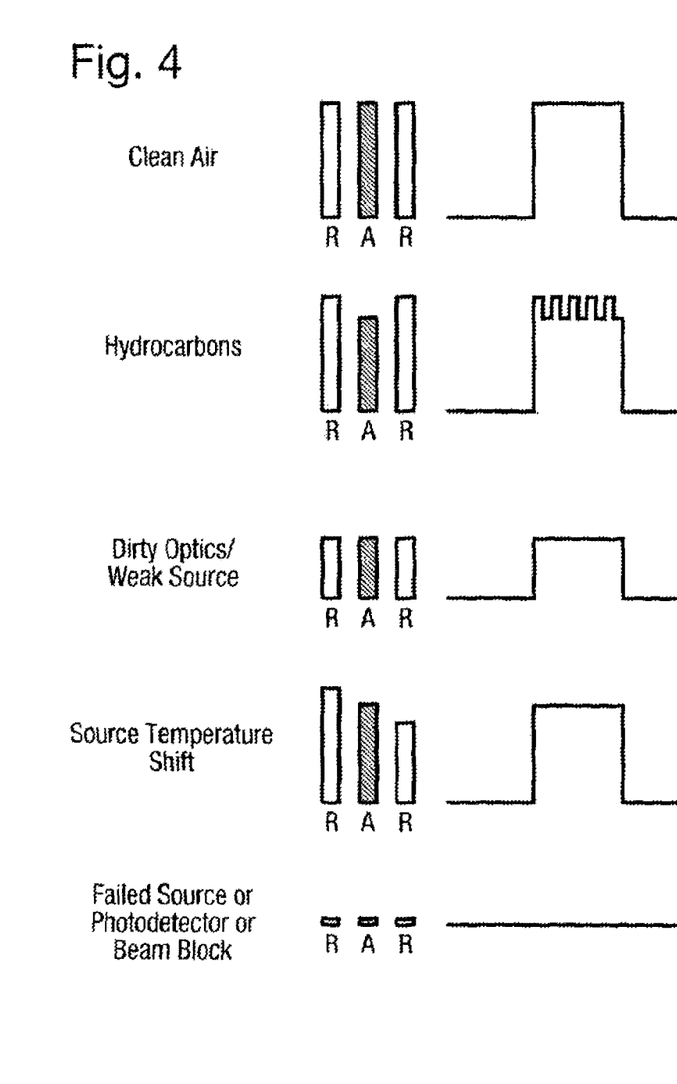
FIG. 4 is a diagram showing the outputs registered by the detector in differing circumstances.

FIG. 4 shows a simplified illustration of the wavelength band intensities (on the left) and the signal output by the photodetector 4 (on the right) for different situations. The R bands are reference bands while the A band is the active band. Thus when there is no hydrocarbon gas present in the air, the active and reference bands are the same and the photodetector signal is unmodulated by the switching of the filter element 6.

When a hydrocarbon gas is present, light in the active band is reduced compared to the reference band due to absorption by the gas. This shows up as a modulation in the photodetector signal corresponding to the switching between the two states. The amplitude of the modulation can be used, together with the difference in the detector output when the source is switched on, to calculate the concentration of gas.

If the source or optics are dirty, transmission of light across both bands will be reduced equally and there will be constant reduction in the photodetector signal with no modulation.

If the source temperature changes between two measurements this will give different absolute detected levels but there will again be no modulation and thus a false reading is avoided.

Finally if there is no signal due to a failed source or blocked beam, again the reference and active bands will be affected equally.

Figure 5:
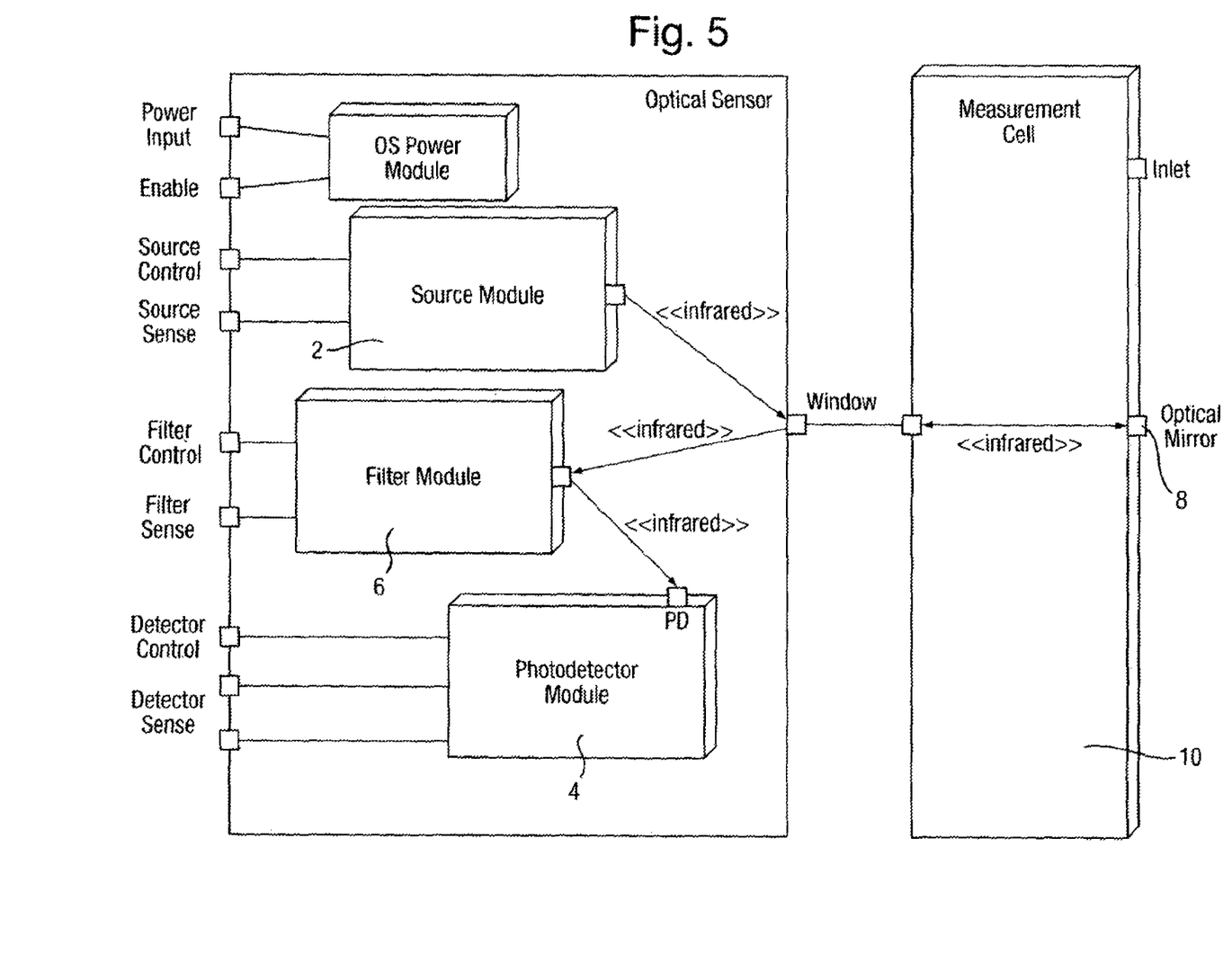
FIG. 5 is a block diagram showing the components of a sensor system in accordance with the invention.

The system is shown in FIG. 5 in the form of a block diagram representation. The Optical sensor" block represents the optical sensor hardware that is controlled by a microcontroller. The light emitted from the source 2 exits through the window to the measurement cell 10. After returning from the measurement cell 10, it is filtered by the MEMS filter 6 (Filter module) and is focused onto the photodetector 4. The ports on the left side are connected to the microcontroller.

The light goes through the following stages. The first stage is generation. The source 2 emits broadband radiation with an intensity and spectral distribution given by the filament temperature. A lens (not shown) collects the light for output to the measurement cell 10.

The second stage is absorption. The radiation passes twice through the measurement volume 10, returning to the window and entrance aperture after reflection in the outer mirror 8. Any hydrocarbons present will attenuate radiation in a wavelength band around 3.3 µm, while other gases, contaminants and dirty optics will attenuate over a broader wavelength range.

The third stage is filtering. The voltage-controlled MEMS optical filter alternately selects the 3.3 µm wavelength measurement band, and a double reference band with peaks on either side of the 3.3 µm measurement band.

The fourth stage is detection. A photodetector 4 measures the filtered light in sync with the filter modulation. The signal is amplified and sampled by the microcontroller.

Figure 6:
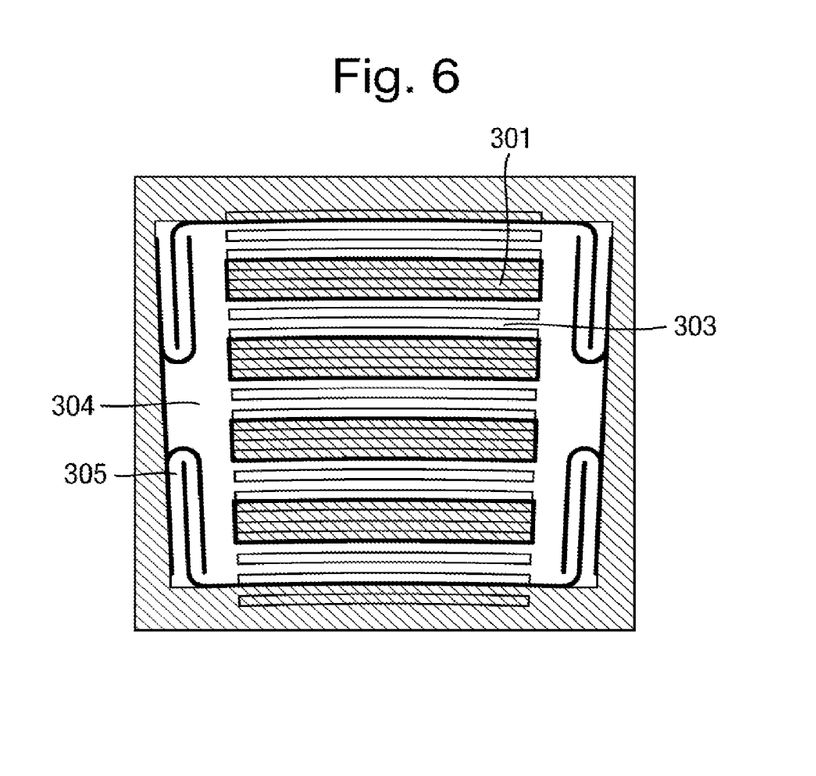
FIG. 6 is a drawing of a portion of the MEMS adaptive filter.
Figure 7:
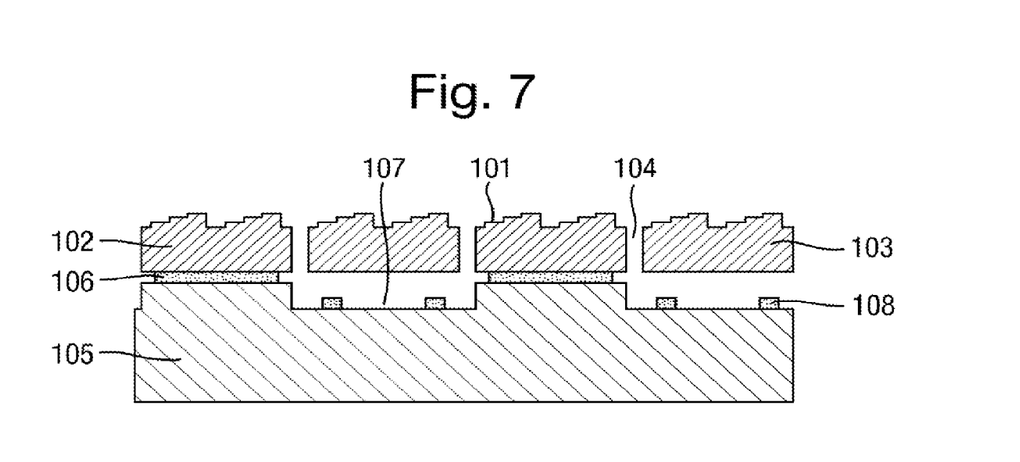
FIG. 7 is a more detailed sectional view of the filter.

FIGS. 6 and 7 show more details of the MEMS adaptive filter. The optical surface of the filter element 4 is a diffractive optical element (DOE) that initially focuses light within a single wavelength band. In order to change from one filter state to another, the optical surface is segmented into bands of movable 303 and static 301 surfaces (this is described in greater detail with reference to FIG. 7). The height difference between these surfaces determines the degree of constructive or destructive interference of the diffracted light. A difference of 830 nm or $\lambda/4$ is needed for destructive interference at the center wavelength of 3.3 µm. Displacement or height difference is achieved by electrostatic actuation of the movable surfaces 303, which are connected to springs 305 and suspended above a substrate 304. The restoring force from the deflected springs 305 balance the electrostatic force until a critical displacement is reached and the whole frame 305 pulls in towards the substrate 304. Then the resulting height difference is determined by the depth of an etched recess in the substrate.

FIG. 7 shows a sectional view of the filter. Alternating static beams 102 and movable beams 103 provide the static and movable surfaces described above. On top of each beam, there is a diffraction grating relief 101. The static beams 102 are attached to the substrate 105 by means of e.g. fusion bonding to the silicon oxide layer 106 whilst the movable beams 103 are able to move in etched recesses 107 against stops 108.

The filter element is electrically equivalent to a voltage dependent capacitor having a capacitance, typically in the range 100 pF to 300 pF initially and increasing with applied voltage. The microcontroller generates a digital square wave that controls a single pole, double throw switch, the output of which alternates between 0V and 24V. The 24V is generated by a step-up regulator. A sense resistor is used to measure the current flow in and out of the capacitor, for self test purposes. This is beneficial as it allows a determination to be made when the filter element is not working. This is important from a safety point of view since if the filter does not function in the embodiments disclosed herein a false negative signal will be given, even in the presence of gas.

Figure 8:
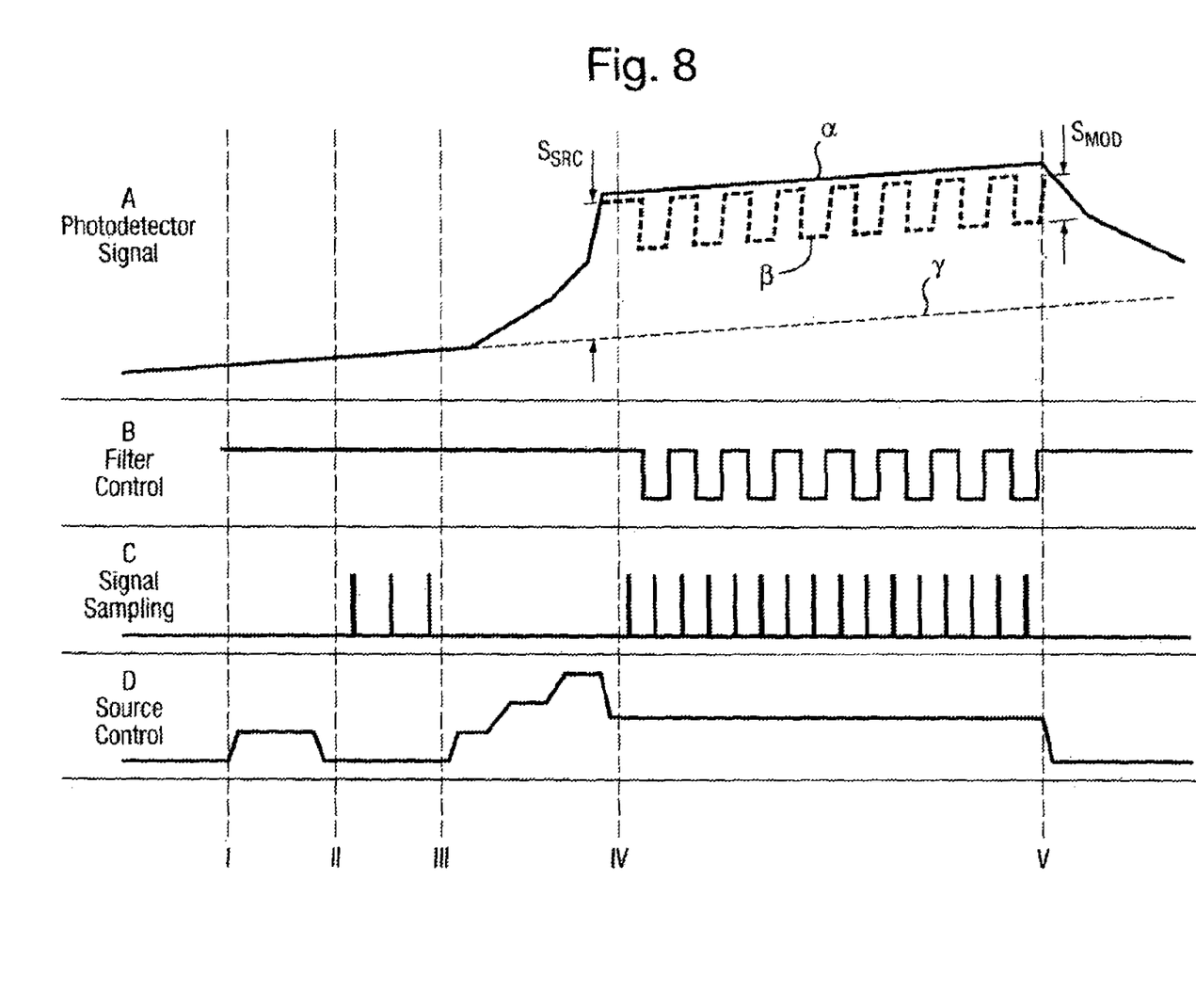
FIG. 8 is a series of graphs showing the variation of certain parameters during operation.

FIG. 8 shows operation of the optical sensor. Looking along the horizontal time axis, at point I, the optical sensor is switched on. During the period between point I and point II the light source is pre-heated. During the next phase up to point III the 'dark' level and slope are measured. Thereafter up to point IV the source is heated. In the final phase from point IV to point V the modulation is measured.

Plot A shows the photodetector signal. The plot labeled alpha is the signal when no gas is present. The plot labeled beta is the signal received when there is a high concentration of the gas being sensed. The plot labeled gamma is the extrapolated dark signal, which is used to calculate corrected values of S_SRC (the increase in signal received resulting from the transmission of light through the measurement volume) and S_MOD (the amplitude of the modulation on the received signal corresponding to absorption of light by the gas in measurement mode) which are explained further below.

Plot B shows the signal generated by the microcontroller to control the operation of the filter element. When the filter control signal is high, the filter is in the reference state, when the control signal goes low, the filter switches to the measurement state.

Plot C shows the signal sampling. First, the dark signal is sampled in order to calculate the level and slope of the gamma curve shown in plot A. Then the signal is sampled in sync with the filter switching. There may be more than two samples each cycle, but for simplicity only one pair of samples is shown per cycle. The values of S_SRC and S_MOD are calculated from the sampled voltages and the extrapolated dark signal. S_SRC and S_MOD are constant during the measurement shown in the figure, but may vary if the source power is not constant. This variation will have little influence on the measurement if the average values of S_SRC and S_MOD are used.

Finally plot D shows the signal from the microcontroller which controls the light source. First, as mentioned above, the source is pre-heated to a temperature that is low enough not to be measured by the detector. The pre-heat stage reduces the time between point III and IV, the ramp-up time, which is beneficial for measurement accuracy and power consumption. After measurement of the dark signal, the source voltage is changed step-wise or continuously until the correct source temperature is reached. In the example shown here a constant voltage is applied during the modulation measurement. In principle the source power voltage may be controlled during the modulation measurement however. The light source may be controlled to step-wise or continuously increase the source temperature to surpass the desired source temperature.

In order to calculate the gas concentration, one needs the following variables: the intensity of the light pulse (S_SRC); and the amplitude of the light modulation (S_MOD). In addition one naturally needs system information such as the optical path-length in the measuring volume, the characteristics of the modulated filter, the approximate source spectrum, and the spectral response of the photodetector. The system information is partially given by design, and partially found from calibration measurements.

A preferred method of determining the gas concentration from the measured signals is through the ratio S_NORM=S_MOD/S_SRC. The sign of S_MOD depends on whether it is in phase with the filter control signal in plot B. When no gas is present, S_MOD (and thus S_NORM) is close to zero. The calibrated signal S_CAL is then calculated as S_CAL=GAIN_S(T)*(S_NORM−S_0(T)), where S_0(T) and GAIN_S(T) are used to compensate for temperature drift and individual variations between filters. The coefficients are determined from calibration measurements using a known gas mixture, over a range of temperatures. The gas concentration is a nonlinear function of S_CAL The photodetector dark level S_DET may drift a significant amount during the measurement, which will lead to measurement error in both S_SRC and S_MOD. To compensate for this, in this embodiment the rate of change of S_DET is measured, and an extrapolated value is used when calculating S_SRC.

Although in the embodiment described the filter has only one measurement state, it could have multiple such states allowing the concentrations of multiple gasses to be measured.

While specific embodiments of the invention have been shown and described in detail to illustrate the application of the principles of the invention, it will be understood that the invention may be embodied otherwise without departing from such principles.

What is claimed is:

1. A gas sensor for measuring a concentration of a gas, the gas sensor comprising:
   a light source configured to be switched on to emit light and to be switched off;
   a measurement volume;
   a detector configured to receive light that has passed through the measurement volume to output a photo detector signal;
   an adaptable filter disposed between the light source and the detector and having a measurement state in which the adaptable filter passes at least one wavelength band which is absorbed by the gas and a reference state in which said at least one wavelength band is attenuated relative to the measurement state; and
   a controller connected to each of the light source, the detector and the adaptable filter, the controller being configured:
   to switch the adaptable filter between the measurement state and the reference state;
   to switch on the light source at a start of a gas sensor operation period and to control power to the light source such that the light source emits a pulse of light above a predetermined threshold during said gas sensor operation period;
   to switch off the light source at an end of the gas sensor operation period so as to enter a low power or shutdown mode, wherein the light source is switched off during the low power or shutdown mode, and wherein:
   the control of power to the light source during said gas sensor operation period includes initiating an initial powering of the light source as a part of the light source emitting the pulse of light;
   the control of power to the light source during said gas sensor operation period includes controlling power to the light source during a measurement stage of the gas sensor operation period as a part of the light source emitting the pulse of light based on controlling the light source to a desired source temperature followed by the light source falling below the desired source temperature;

the control of power to the light source during said gas sensor operation period includes controlling power to the light source during a dark signal stage, following the initial powering and prior to the measurement stage, of the gas sensor operation period as a part of the light source emitting the pulse of light;

the control of power to the light source during said gas sensor operation period includes controlling power to the light source during a ramp-up time, after the dark signal stage and prior to the measurement stage, of the gas sensor operation period as a part of the light source emitting the pulse of light, based on controlling the light source to step-wise or continuously increase the source temperature to surpass the desired source temperature and thereafter to control the light source at the correct source temperature; and the switching of the adaptable filter comprises changing the adaptable filter between one said measurement state and one said reference state during the measurement stage of said gas sensor operation period and subsequent to the light source reaching the desired source temperature and prior to the light source falling below the desired source temperature;

to sample the photo detector signal during the dark signal stage, subsequent to the initiating the initial powering of the light source and prior to the ramp-up time;

to sample the photo detector signal with the adaptable filter in the measurement state during said gas sensor operation period, subsequent to the light source reaching the desired source temperature and prior to the light source falling below the desired source temperature; and to sample the photo detector signal with the adaptable filter in the reference state during said gas sensor operation period, subsequent to the light source reaching the desired source temperature and prior to the light source falling below the desired source temperature.

2. The gas sensor of claim 1, wherein:
the controller is configured to sample the photo detector signal during the dark signal stage a plurality of times to provide a plurality of dark signal stage samples; and
the controller is configured to measure a rate at which an output from the detector, represented by plurality of dark signal stage samples, changes with time.

3. The gas sensor of claim 1, wherein the adaptable filter comprises a micro-electro mechanical system (MEMS).

4. The gas sensor of claim 3, wherein said MEMS filter comprises an arrangement for measuring a change of capacitance therein for diagnostic purposes.

5. The gas sensor of claim 1, wherein the adaptable filter comprises a diffractive optical element having a plurality of grating bands arranged to be moved by an electrostatic potential.

6. The gas sensor of claim 1, wherein said light source is the only light source and wherein said detector is the only detector.

7. The gas sensor of claim 1, wherein the adaptable filter comprises a plurality of measurement states in each of which the adaptable filter passes at least one wavelength band which is absorbed by the gas and for each measurement at least one reference state in which the wavelength band corresponding to the measurement state is attenuated relative to said measurement state.

8. The gas sensor of claim 1, wherein the controller is adapted to change the adaptable filter between said measurement state and one said reference state a plurality of times during said gas sensor operation period, subsequent to the light source reaching the desired source temperature and prior to the light source falling below the desired source temperature and the sampling of the photo detector signal is synchronized by the controller to occur each time the adaptable filter is in the measurement state during said gas sensor operation period and subsequent to the light source reaching the desired source temperature and to occur each time the adaptable filter is in the reference state during said gas sensor operation period and subsequent to the light source reaching the desired source temperature.

9. The gas sensor of claim 1, wherein:
the initial powering of the light source comprises initiating a pre-heat stage of the gas sensor operation period as a part of the light source emitting the pulse of light to preheat the light source to a temperature below a desired source temperature; and
the sampling of the photo detector signal during the dark signal stage occurs with the light source heated to a temperature that is low enough not to be measured by the detector.

10. The gas sensor of claim 9, wherein:
the controller is configured to power the light source for a period to provide the pre-heat stage and to subsequently not power the light source during the dark signal stage up to the ramp-up time; and
the sampling of the photo detector signal during the dark signal stage occurs with the controller not powering the light source.

11. A wireless, battery-operated gas detector unit comprising the gas sensor of claim 1.

12. A method of measuring a concentration of a gas, the method comprising the steps of:
providing a gas sensor for measuring a concentration of a gas, the gas sensor comprising a light source configured to be switched on, to be power controlled to control light being emitted and to be switched off, a measurement volume, a detector configured to receive light that has passed through the measurement volume to output a photo detector signal, an adaptable filter disposed between the light source and the detector and having a measurement state in which the adaptable filter passes at least one wavelength band which is absorbed by the gas and a reference state in which said at least one wavelength band is attenuated relative to the measurement state; and a controller connected to each of the light source, the detector and the adaptable filter;

switching on, with the controller, the light source at a start of a gas sensor operation period such that the light source emits a pulse of light above a predetermined threshold;

switching off, with the controller, the light source at an end of the gas sensor operation period so as to enter a low power or shutdown mode, wherein the light source is switched off during the low power or shutdown mode;

controlling, with the controller, power to the light source during said gas sensor operation period, including initiating an initial powering of the light source as a part of the light source emitting the pulse of light, and subsequent to said initiating an initial powering, controlling power to the light source during a measurement stage of the gas sensor operation period as a part of the light source emitting the pulse of light based on controlling the light source to a desired source temperature followed by the light source falling below the desired source temperature, controlling power to the light source during a dark signal stage, following the initial powering and prior to the measurement stage, of the gas sensor operation period as a part of the light source emitting the pulse of light and controlling power to the light source during a ramp-up time, after the dark signal stage and prior to the measurement stage, of the gas sensor operation period as a part of the light source emitting the pulse of light, based on controlling the light source to step-wise or continuously increase the source temperature to surpass the desired source temperature and thereafter to control the light source at the correct source temperature;

switching, with the controller, the adaptable filter between the measurement state and the reference state comprising changing the adaptable filter between one said measurement state and one said reference state during said gas sensor operation period, subsequent to the light source reaching the desired source temperature and prior to the light source falling below the desired source temperature;

sampling, with the controller, the photo detector signal during the dark signal stage, subsequent to initiating the initial powering of the light source and prior to the ramp-up time;

sampling, with the controller, the photo detector signal with the adaptable filter in the measurement state during said measurement stage of the gas sensor operation period and prior to the light source falling below the desired source temperature; and sampling, with the controller, the photo detector signal with the adaptable filter in the reference state during the measurement stage of said gas sensor operation period, subsequent to the light source reaching the desired source temperature and prior to the light source falling below the desired source temperature.

13. The method of claim 12, wherein the sampling during said gas sensor operation period and subsequent to the light source reaching the desired source temperature provides a gas concentration measurement using only the light source as a single light source and using only the detector as a single light detector.

14. The method of claim 12, wherein:
the switching of the adaptable filter between the measurement state and the reference state comprises changing the adaptable filter between said measurement state and said reference state a plurality of times during said gas sensor operation period and subsequent to the light source reaching the desired source temperature;
the sampling of the photo detector signal occurs each time the adaptable filter is in the measurement state during said gas sensor operation period and subsequent to the light source reaching the desired source temperature; and
the sampling of the photo detector signal occurs each time the adaptable filter is in the reference state during said gas sensor operation period and subsequent to the light source reaching the desired source temperature.

15. The method of claim 12, wherein the sampling during said gas sensor operation period and subsequent to the light source reaching the desired source temperature provides a gas concentration measurement using a modulation amplitude based on the photo detector signal.

16. The method of claim 12, wherein the sampling of the photo detector signal during the dark signal stage comprises a plurality of samples and further comprising measuring a rate at which an output from the detector, represented by the plurality of samples, changes with time.

17. The method of claim 12, wherein the adaptable filter comprises a plurality of measurement states in each of which the adaptable filter passes at least one wavelength band which is absorbed by the gas and for each measurement at least one reference state in which the wavelength band corresponding to the measurement state is attenuated relative to said measurement state, and the method further comprises switching to each of said measurement states at least once during said gas sensor operation period and subsequent to the light source reaching the desired source temperature.

18. The method of claim 12, wherein:
the initial powering of the light source comprises initiating a pre-heat stage of the gas sensor operation period as a part of the light source emitting the pulse of light to preheat the light source to a temperature below a desired source temperature; and
the sampling of the photo detector signal during the dark signal stage occurs with the light source heated to a temperature that is low enough not to be measured by the detector.

19. A gas sensor for measuring a concentration of a gas, the gas sensor comprising:
a light source configured to be power controlled to control light being emitted and to be switched off;
a measurement volume;
a detector configured to receive light that has passed through the measurement volume to output a photo detector signal;
an adaptable filter disposed between the light source and the detector and having a measurement state in which the adaptable filter passes at least one wavelength band which is absorbed by the gas and a reference state in which said at least one wavelength band is attenuated relative to the measurement state; and
a controller connected to each of the light source, the detector and the adaptable filter, the controller being configured:
to switch on the light source at a start of a gas sensor operation period to control power to the light source such that the light source emits a pulse of light above a predetermined threshold during said gas sensor operation period and to switch off the light source at an end of the gas sensor operation period, wherein
the control of power to the light source during said gas sensor operation period includes initiating an initial powering of the light source to preheat the light source to a temperature below a desired source temperature during a pre-heat stage of the gas sensor operation period as a part of the light source emitting the pulse of light;
the control of power to the light source during said gas sensor operation period includes controlling power to the light source during a dark signal stage, following the initial powering as a part of the light source emitting the pulse of light;
the control of power to the light source during said gas sensor operation period includes controlling power to the light source during a ramp-up time, after the dark signal stage as a part of the light source emitting the pulse of light, based on controlling the light source to step-wise or continuously increase the source temperature to surpass the desired source temperature and thereafter to control the light source at the correct source temperature;

the control of power to the light source during said gas sensor operation period includes controlling power to the light source during a measurement stage of the gas sensor operation period as a part of the light source emitting the pulse of light based on controlling the light source to the desired source temperature following the ramp-up time, with the a measurement stage being followed by the light source falling below the desired source temperature;

to sample the photo detector signal during the dark signal stage;

to switch the adaptable filter between the measurement state and the reference state, including changing the adaptable filter between one said measurement state and one said reference state during the measurement stage;

to sample the photo detector signal with the adaptable filter in the measurement state during the measurement stage and prior to the light source falling below the desired source temperature; and to sample the photo detector signal with the adaptable filter in the reference state during the measurement stage and prior to the light source falling below the desired source temperature.

20. The gas sensor of claim 19, wherein:

the controller is configured to sample the photo detector signal subsequent to the pre-heat stage and prior to reaching the desired source temperature a plurality of times to provide a plurality of samples;

the controller is configured to measure a rate at which an output from the detector, represented by the plurality of samples, changes with time; and the controller is adapted to change the adaptable filter between said measurement state and one said reference state a plurality of times during said gas sensor operation period and subsequent to the light source reaching the desired source temperature and the sampling of the photo detector signal is synchronized by the controller to occur each time the adaptable filter is in the measurement state during said gas sensor operation period and subsequent to the light source reaching the desired source temperature and to occur each time the adaptable filter is in the reference state during said gas sensor operation period and subsequent to the light source reaching the desired source temperature.

21. The gas sensor of claim 19, wherein the pulse has a pulse width between 5 milliseconds and 5 seconds.

22. The gas sensor of claim 19, wherein the pulse has a pulse width between 10 and 1000 milliseconds.

* * * * *